US006475285B2

(12) United States Patent
Ikegami et al.

(10) Patent No.: US 6,475,285 B2
(45) Date of Patent: Nov. 5, 2002

(54) DEPOSITION APPARATUS

(75) Inventors: Hiroshi Ikegami, Hiratsuka; Nobuo Hayasaka, Yokosuka; Shinichi Ito; Katsuya Okumura, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 22 days.

(21) Appl. No.: 09/817,196

(22) Filed: Mar. 27, 2001

(65) Prior Publication Data

US 2001/0027748 A1 Oct. 11, 2001

(30) Foreign Application Priority Data

Mar. 28, 2000 (JP) ....................................... 2000-089738

(51) Int. Cl.[7] ................................................ C23C 16/00
(52) U.S. Cl. ....................................................... 118/715
(58) Field of Search ................................ 118/712, 319, 118/504, 505, DIG. 3, DIG. 4, 715, 52; 427/348, 349, 420

(56) References Cited

U.S. PATENT DOCUMENTS

| | | | | | |
|---|---|---|---|---|---|
| 3,900,639 | A | * | 8/1975 | Lauterbach | 427/34 |
| 4,414,059 | A | * | 11/1983 | Blum et al. | 156/659.1 |
| 4,664,940 | A | * | 5/1987 | Bensoussan et al. | 427/53.1 |
| 4,784,933 | A | * | 11/1988 | Kanada et al. | 430/204 |
| 4,895,735 | A | * | 1/1990 | Cook | 427/43.1 |
| 4,915,757 | A | * | 4/1990 | Rando | 156/64 |
| 5,237,383 | A | * | 8/1993 | Parisi | 356/73.1 |
| 5,317,126 | A | * | 5/1994 | Couch, Jr. et al. | 219/121.51 |
| 5,372,862 | A | * | 12/1994 | Krishnaswamy | 427/596 |
| 5,885,659 | A | * | 3/1999 | Takahashi et al. | 427/420 |
| 5,928,425 | A | * | 7/1999 | Lee | 118/712 |
| 6,096,163 | A | * | 8/2000 | Wensel | 156/357 |
| 6,159,832 | A | * | 12/2000 | Mayer | 438/584 |
| 6,162,745 | A | | 12/2000 | Ito et al. | |

FOREIGN PATENT DOCUMENTS

| | | | | |
|---|---|---|---|---|
| JP | 60067665 | * | 4/1985 | C23C/14/028 |
| JP | 62136017 | * | 6/1987 | H01I/21/205 |
| JP | 2-220428 | | 9/1990 | |
| JP | 6-151295 | | 5/1994 | |
| JP | 8-45832 | | 2/1996 | |
| JP | 11006086 | * | 1/1999 | C23F/4/00 |
| JP | 2000-77326 | | 3/2000 | |
| JP | 2000-188251 | | 7/2000 | |

OTHER PUBLICATIONS

Shinichi, Ito et al., "Apparatus and Method of Forming Liquid Film", Serial No. 09/335,508, filed Jun. 8, 1999.

Shinichi, Ito et al., "Liquid Film Forming Method", Serial No. 09/669,725, filed Sep. 26, 2000.

Tatsuhiko ema et al., Deposition Method, Deposition Apparatus, and Pressure–Reduction Dry Apparatus, Serial No. 09/735,553, f iled Dec. 14, 2000.

* cited by examiner

*Primary Examiner*—Gregory Mills
*Assistant Examiner*—Karla Moore
(74) *Attorney, Agent, or Firm*—Finnegan, Henderson, Farabow, Garrett & Dunner, L.L.P.

(57) ABSTRACT

A deposition apparatus includes a chemical discharging nozzle for continuously discharging chemicals to a substrate to be processed, a gas spraying section arranged below the chemical discharging nozzle, for spraying gas on the chemicals discharged from the chemical discharging nozzle and changing an orbit of the chemicals by pressure of the gas, a chemical collecting section for collecting the chemicals the orbit of which is changed by the gas spraying section, the chemical collecting section being arranged so as to interpose the chemicals between the gas spraying section and the chemical collecting section, and a moving section for moving the chemical discharging nozzle and the substrate relatively with each other. The gas spraying section includes a laser oscillator for emitting a laser beam, and a gas generating film that generates the gas when heated and gasified by the laser beam emitted from the laser oscillator.

19 Claims, 11 Drawing Sheets

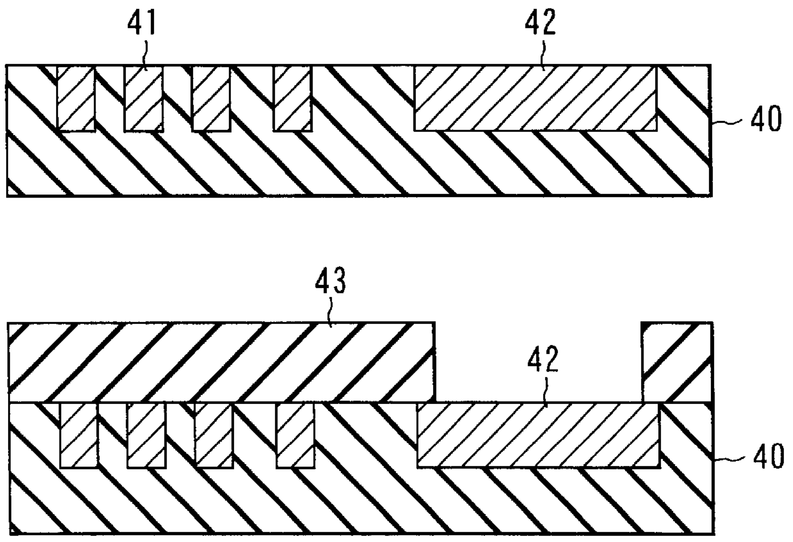
FIG. 9A
FIG. 9B
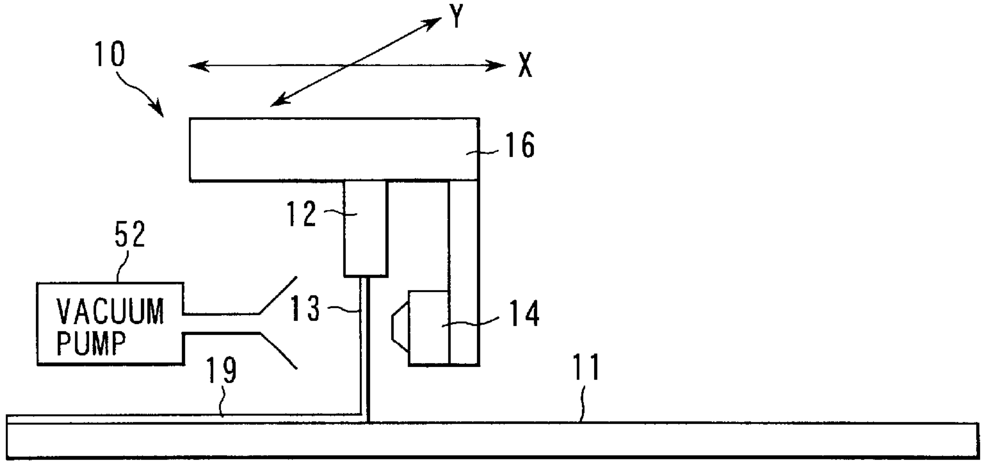
FIG. 10A
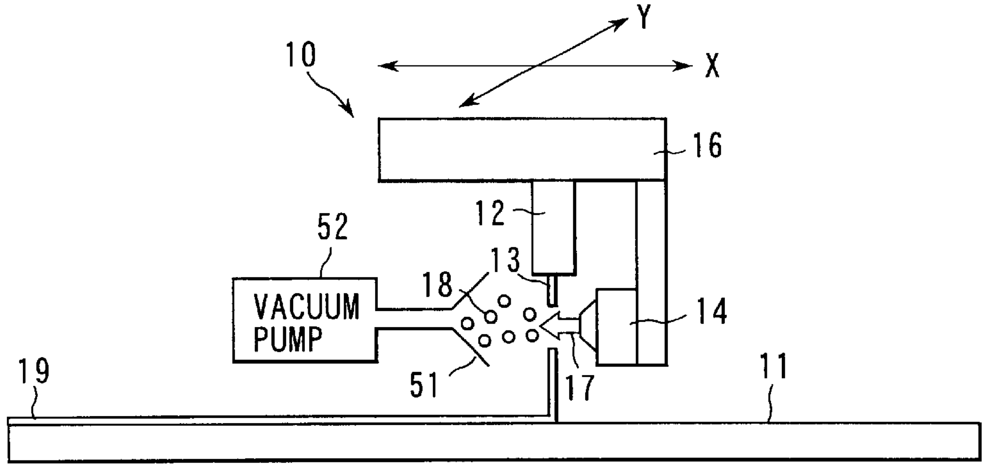
FIG. 10B

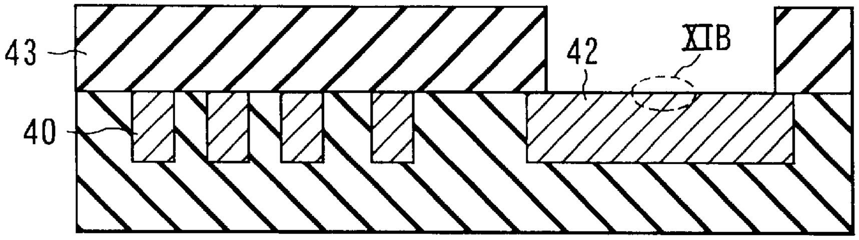
FIG. 11A
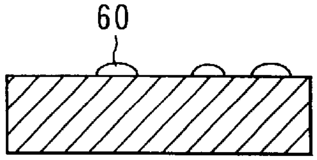
FIG. 11B
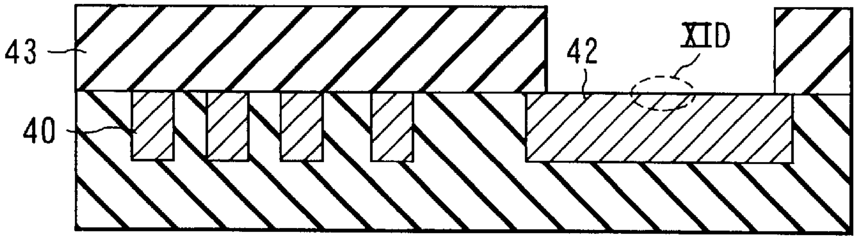
FIG. 11C
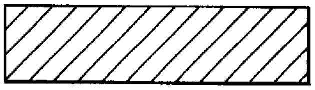
FIG. 11D
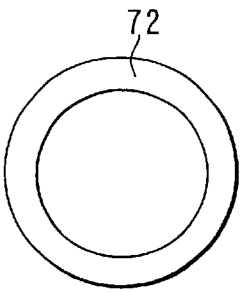
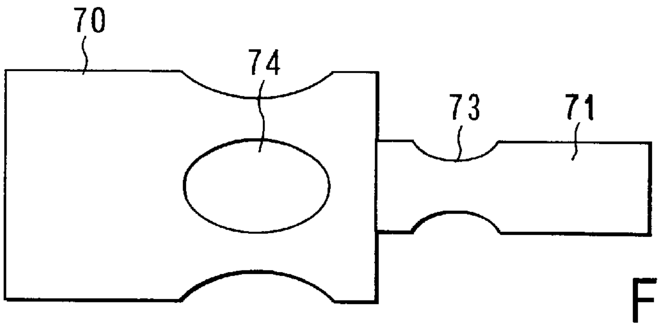
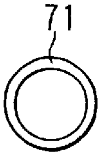
FIG. 12C
FIG. 12B
FIG. 12A

DEPOSITION APPARATUS

CROSS-REFERENCE TO RELATED APPLICATIONS

This application is based upon and claims the benefit of priority from the prior Japanese Patent Application No. 2000-089738, filed Mar. 28, 2000, the entire contents of which are incorporated herein by reference.

BACKGROUND OF THE INVENTION

The present invention relates to a deposition apparatus for coating a substrate to be processed with liquid and, more particularly, to a deposition apparatus used for controlling the amount of coating.

A spin coating method used in a lithography process is known as a method of forming a liquid film on a substrate. The spin coating method has recently been applied to the formation of an insulation film and a metal film. In this method, however, most of chemicals supplied onto a substrate are discharged therefrom and the remaining only several percent chemicals are used for the formation. The chemicals are wasted and adversely affect the environment. Using a square substrate or a 12-inch-or-more circular substrate, turbulent air occurs on the outer region of the substrate to make the thickness of this region nonuniform.

As an apparatus for uniformly coating the entire surface of a substrate with chemicals without wasting them, Jpn. Pat. Appln. KOKAI Publication No. 2-220428 discloses an apparatus for forming a uniform film by discharging a resist solution from a number of nozzles arranged in a line and spraying gas or chemicals onto the film-forming surface of a substrate from behind the resist solution. Jpn. Pat. Appln. KOKAI Publication No. 6-151295 teaches an apparatus for forming a uniform film by spraying a resist solution on a substrate from a number of spray nozzles provided in a rod. In these prior art apparatuses, a uniform film is formed by scanning the surface of a substrate with a plurality of discharge or spray nozzles arranged in a lateral direction. However, the apparatuses cannot locally control the thickness of a film-forming surface of the substrate.

A method of forming a liquid film by supplying chemicals from a nozzle to a film-forming surface of a substrate to be processed is proposed as one for controlling the amount of coating within the surface of a substrate without wasting chemicals. The control of the amount of coating is performed using a precise coating nozzle that can start and stop the discharge of chemicals. The precise coating nozzle controls the amount of discharge by driving a valve of a needle or a screw provided at the upper portion thereof.

The above method has the following problem: When the valve is driven, friction between the valve and the chemicals causes particles, and the particles, which are contained in the chemicals dropped when the valve is opened, are transferred onto the substrate. Immediately after the valve is opened, the pressure exerted on the chemicals varies to produce a pulsating flow and cause a difference in the thickness of a formed film.

As a method of controlling the amount of discharge of chemicals to inhibit the mixture of particles and the production of a pulsating flow, U.S. patent application Ser. No. 09/335,508 discloses a method of cutting off the supply of chemicals by spraying gas on the dropped chemicals from the sides of the chemicals.

In the U.S. Patent Application, a gas generating film is irradiated with light to generate gas, and the pressure of the gas changes an orbit of chemicals discharged from a nozzle. The chemicals whose orbit has changed are collected by a chemical collecting section disposed below and prevented from being supplied to the substrate.

In the method of U.S. patent application Ser. No. 09/335,508, the gas generating film is heated and gasified by light irradiation, whereas the influence of light irradiation upon chemicals dropped ahead of the film should be controlled. However, the method of the U.S. Patent Application does not take any measures against the influence of light irradiation.

If, moreover, a plate-like gas generating film is placed in a unit moving section, the number of times the chemicals drop can be reduced only about 100 times because the dropped chemicals are restricted by the size of the film. In order to cut off the supply of chemicals to the entire surface of a substrate to be processed, the chemicals have to reduce from $10^5$ to $10^7$ spots of the substrate. It is therefore the problem of the U.S. Patent Application that the number of spots from which the chemicals are reduced is small.

BRIEF SUMMARY OF THE INVENTION

An object of the present invention is to provide a deposition apparatus for forming a film by locally controlling the number of chemicals to be dropped by the pressure of gas generated from a gas generating film by irradiation of light, which is capable of controlling the influence of light applied to the gas generating film upon the chemicals.

Another object of the present invention is to provide a deposition apparatus capable of easing the restriction on the number of times the chemicals to be dropped are reduced.

In order to attain the above objects, the present invention is constituted as follows.

(a) A deposition apparatus comprising: a chemical discharging nozzle for continuously discharging chemicals to a substrate to be processed; a gas spraying section arranged below the chemical discharging nozzle, for spraying gas on the chemicals discharged from the chemical discharging nozzle and changing an orbit of the chemicals by pressure of the gas; a chemical collecting section for collecting the chemicals the orbit of which is changed by the gas spraying section, the chemical collecting section being arranged so as to interpose the chemicals between the gas spraying section and the chemical collecting section; and moving means for moving the chemical discharging nozzle and the substrate relatively with each other, wherein the gas spraying section includes: a laser oscillator for emitting a pulse laser beam; and a gas generating film that generates the gas when heated and gasified by the laser beam emitted from the laser oscillator.

(b) A deposition apparatus comprising: a chemical discharging nozzle for continuously discharging chemicals to a substrate to be processed; a gas spraying section arranged below the chemical discharging nozzle, for spraying gas on the chemicals discharged from the chemical discharging nozzle and changing an orbit of the chemicals by pressure of the gas; a chemical collecting section for collecting the chemicals the orbit of which is changed by the gas spraying section, the chemical collecting section being arranged so as to interpose the chemicals between the gas spraying section and the chemical collecting section; and moving means for moving the chemical discharging nozzle and the substrate relatively with each other, wherein the gas spraying section includes: a light emitting section for emitting light; a tape-shaped gas generating film that generates the gas when heated and gasified by the light emitted from the light emitting section; and a winding device for winding the gas generating film.

The above constitution of the present invention produces the following advantages:

By controlling the pulse width of a laser beam so as to stop the irradiation of the laser beam before the gas generating film is gasified, the laser beam can be prevented from being applied to the chemicals to be dropped. Therefore, the laser beam does not have an influence on the chemicals.

Since the winding device winds the tape-shaped gas generating film, the restriction on the number of times the chemicals to be dropped are reduced can be eased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a cross-sectional view of a substrate for explaining a deposition method according to a fourth embodiment of the present invention;

FIG. 9B is a cross-sectional view of an SOG film formed by the deposition method according to the fourth embodiment of the present invention;

FIG. 10A is a schematic view of a deposition apparatus according to a fifth embodiment of the present invention;

FIG. 10B is another schematic view of a deposition apparatus according to the fifth embodiment of the present invention;

FIG. 11A is a view of the structure of a substrate on which a film is formed using a chemical collecting section shown in FIGS. 1A and 1B;

FIG. 11B is an enlarged cross sectional view of portion XIB of FIG. 11A;

FIG. 11C is a view of the structure of a substrate on which a film is formed using a chemical collecting section shown in FIGS. 10A and 10B;

FIG. 11D is an enlarged cross sectional view of portion XID of FIG. 11C;

FIG. 12A is a schematic view of the structure of a nozzle used in a deposition apparatus according to a sixth embodiment of the present invention;

FIG. 12B is a cross-sectional view of the outlet 72 of the nozzle 70;

FIG. 12C is a cross-sectional view of the inlet 71 of the nozzle 70.

DETAILED DESCRIPTION OF THE INVENTION

Embodiments of the present invention will now be described with reference to the accompanying drawings.

[First Embodiment]

Figure 1A:
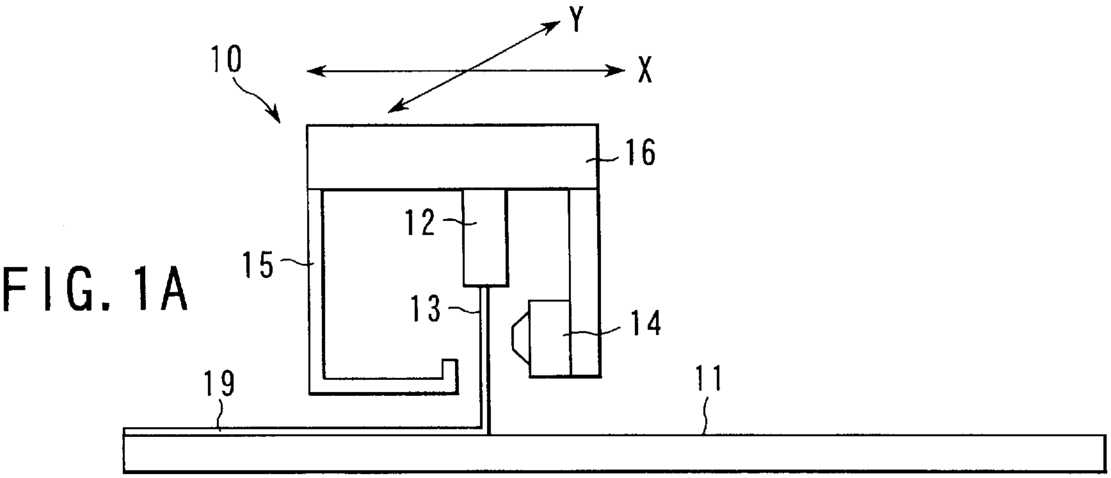
FIG. 1A is a schematic view showing the structure of a deposition apparatus according to a first embodiment of the present invention.
Figure 1B:
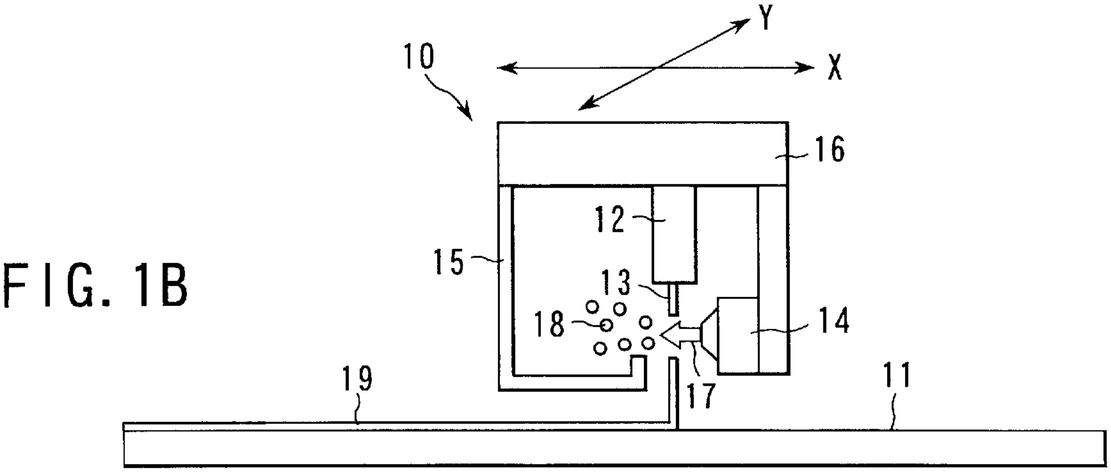
FIG. 1B is another schematic view showing the structure of the deposition apparatus according to the first embodiment of the present invention.

FIGS. 1A and 1B are schematic views of the structure of a deposition apparatus according to a first embodiment of the present invention.

In the first embodiment, an 8-inch-diameter semiconductor substrate is used as a substrate 11 to be processed, on which a liquid film is formed.

As FIG. 1A shows, a chemical supply unit 10 for selectively forming a liquid film is provided above the substrate 11 placed horizontally on a sample stage (not shown). The chemical supply unit 10 includes a chemical discharging nozzle 12 for discharging chemicals 13, a high-pressure gas spraying section 14 for spraying high pressure on the chemicals, a chemical collecting section 15, and a driving section 16.

The chemical discharging nozzle 12 discharges the chemicals 13 to the substrate 11. The chemical collecting section 15 collects the chemicals 13 discharged from the nozzle 12 to cut off the supply of chemicals 13 to the substrate 11 from the nozzle 12. The driving section 16 moves the chemical supply unit 10 in the direction of X and turns it at a given pitch in the direction of Y. The chemical discharging nozzle 12 thus discharges the chemicals 13 to the substrate 11 to form a liquid film 19 on the substrate 11.

The moving speed of the driving section 16 can be set within the range from 1 m/sec. to 10 m/sec. and the optimum moving speed can be selected in accordance with the thickness of a formed film and the viscosity of the chemicals. The pitch at which the unit 10 moves in the direction of Y can be set within the range from 10 μm to 500 μm and the optimum pitch can also be selected in accordance with the thickness of a formed film and the viscosity of the chemicals.

As FIG. 1B shows, the patterning of the liquid film 19 and the local control of the amount of coating are performed by blowing the chemicals 13, which are continuously discharged by high-pressure gas 17 that is sprayed from the high-pressure gas spraying section 14 set alongside the discharged chemicals 13, and reducing the amount of coating. If the scattering of blown chemicals 18 toward the substrate 11 causes a problem, the chemical collecting section 15 collects the blown chemicals 18 to prevent them from being scattered on the substrate 11. If not, the chemical collecting section 15 need not be provided, with the result that a film can be formed while forming an uncoated region by changing an orbit of the chemicals 13 by the high-pressure gas 17.

Figure 2A:
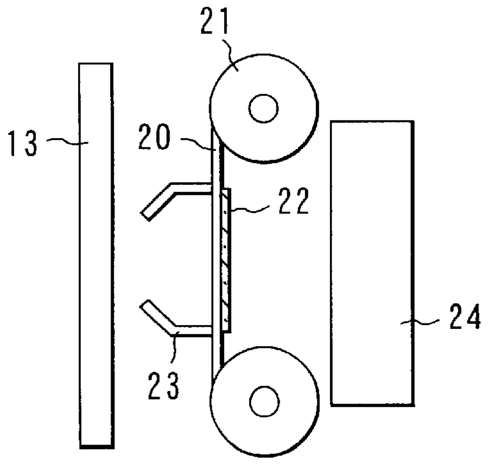
FIG. 2A is a schematic view of the structure of a high-pressure gas issuing section of the deposition apparatus according to the first embodiment of the present invention.
Figure 2B:
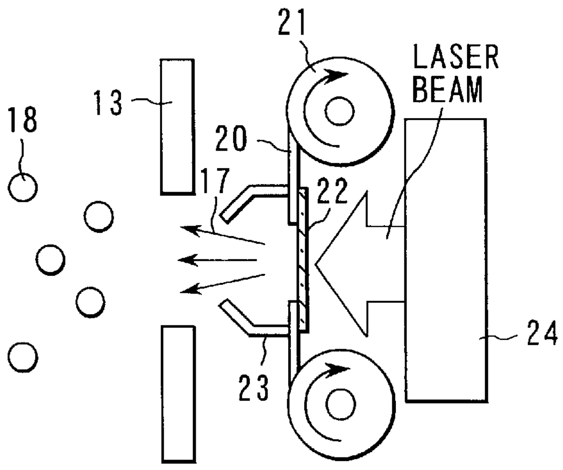
FIG. 2B is another schematic view of the structure of the high-pressure gas issuing section of the deposition apparatus according to the first embodiment of the present invention.

The high-pressure gas spraying section of the deposition apparatus according to the above first embodiment will now be described. FIGS. 2A and 2B are schematic views of the structure of the high-pressure gas spraying section.

As FIG. 2A illustrates, the high-pressure gas spraying section 14 includes a laser oscillator 24 for emitting a pulse laser beam, a gas generating film 20 wounded on two cylindrical winding devices 21 and gasified by the laser beam, a transparent substrate 22 that is interposed between the gas generating film 20 and the laser oscillator 24 and transparent to the laser beam, and a gas spraying nozzle 23 for spraying gas on chemicals efficiently. When the gas generating film 20 generates gas, the gas diffuses, while the gas generated from the transparent substrate 22 can efficiently be sprayed toward the chemicals 13. The winding device 21 rotates and accordingly the gas generating film 20 can move.

An operation of the high-pressure gas spraying section will now be discussed. As FIG. 2B shows, the laser oscillator 24 emits a laser beam from the transparent substrate 22 to gasify an area of the gas generating film 20. The gas spraying nozzle 23 sprays high-pressure gas 17 and blows the chemicals 13 that are located in front of the gas spraying nozzle 23.

The chemicals can be blown $10^7$ times or more by adjusting the length of the gas generating film 20 and rotating the winding devices 21. The chemicals can thus be cut off from the whole surface of the wafer.

In the first embodiment, the gas generating film 20 is a film formed by adding an about-1-% coloring agent, which absorbs infrared light from visible light, to nitrocellulose. The above laser oscillator is a semiconductor laser whose average output power is about 1 W and which outputs infrared light whose wavelength is 780 nm.

Under the above conditions, the chemicals can be blown at very high speed because the time from when the semiconductor laser emits a laser beam until when the chemicals are blown is about 25 μsec. The time of 25 μsec. contains 10 μsec. that are required from when the gas generating film is irradiated with a laser beam until when it is increased in temperature and gasified, several microseconds that are required until the generated gas reaches the chemicals, and 10 μsec. that are required for blowing the chemicals.

If the gas generating film continues to be irradiated with a laser beam even after it is gasified, the laser beam influences the chemicals. If the chemicals are a resist solution, they may be sensitized. Thus, the pulse width of the laser beam should be controlled so as to stop light irradiation before the gas generating film is gasified, or the wavelength of light, which reacts only to the gas generating film and not to the drop chemicals, should be selected.

In the first embodiment, the pulse width of the laser oscillator is set at 10 μsec., which is the same as the time required from when the gas generating film is irradiated with a laser beam until when it is increased in temperature and gasified. As described above, 25 μsec. is needed from when the laser beam is emitted until when the chemicals are blown.

Gas is generated instantaneously by emitting pulses from the laser oscillator with the pulse width of 10 μsec. and the pulse period of 25 μsec. and gasifying the gas generating film 20.

In the first embodiment described above, the gas generating film and the laser are employed; however, a film that can generate gas by laser irradiation and a laser can be combined with each other. For example, when a laser having a wavelength of 300 nm or shorter (YAG fourth harmonic, KrF excimer laser, ArF excimer laser, etc.) is used, no coloring agents need to be added to a nitrocellulose film. When the gas spraying nozzle is filled with oxygen, a graphite thin film can be used as matter that generates gas and, in this case, a laser having a wavelength of any of ultraviolet, visible and infrared rays can be used. Whatever gas generating film is used, it is necessary to secure the flow rate of gas to blow the dropped chemicals. The required flow rate is empirically obtained by $fg \geqq fs$ where fs (m/sec.) is the flow velocity of dropped chemicals and fg (m/sec.) is the flow velocity of high-pressure gas. Since the flow velocity of chemicals is 5 m/sec. in the first embodiment, that of high-pressure gas 17 should be 5 m/sec. or more. In order to form the gas generating film 20 of a nitrocellulose film, the thickness of the nitrocellulose film should be 5 μm or more because the above flow velocity can be secured when the thickness is 5 μm.

In the deposition apparatus of the present invention, a gas generating film is heated and gasified by irradiation with light, while the irradiation has to be inhibited from having an influence on drop chemicals in front of the gas generating film. In U.S. patent application Ser. No. 09/335,508, a system is proposed in which a gas generating film is gasified by irradiation with light and drop chemicals in front of the film are cut off by gas generated from the gasified generating film. However, the U.S. Patent Application makes no mention of a method of inhibiting an influence of light irradiation upon the drop chemicals. To inhibit the influence, the pulse period of laser beams should be controlled so as to stop the light irradiation before the gas generating film is gasified, or the wavelength of light, which reacts only to the gas generating film and not to the drop chemicals, should be selected.

When a 5-$\mu$m-thickness gas generating film is irradiated with a 1-W laser beam at room temperature as illustrated in FIGS. 2A and 2B, it can be gasified to prevent the dropped chemicals from being irradiated with the laser beam by setting the pulse width of the laser at 10 $\mu$sec. and the pulse period thereof at 25 $\mu$sec.

In the first embodiment of the present invention, even though the pulse width is adjusted, a time period from when a gas generating film is irradiated with a laser beam until when it is gasified varies slightly. Therefore, a semiconductor laser whose wavelength is 780 nm is used to inhibit the laser beam from having an influence upon the dropped chemicals.

The nitrocellulose film used as the gas generating film absorbs only the light whose wavelength is shorter than that of DUV light. Thus, a coloring agent that absorbs a laser beam having a wavelength of 780 nm is added to the gas generating film, and the gas generating film can absorb the laser beam even by the use of the semiconductor laser.

When a resist solution or an SOG solution is used as dropped chemicals, the chemicals are not influenced by light having a wavelength of 780 nm even though they are directly irradiated with the light.

U.S. patent application Ser. No. 09/335,508 teaches that a gas generating film is formed of nitrocellulose or the like. However, when the nitrocellulose is used as it is, the following problem occurs: DUV light needs to be used as irradiation light and, if resist is dropped, it is sensitized.

As described above, in order to achieve the method of the present invention, the pulse width of the laser needs to be adjusted appropriately in accordance with the temperature and thickness of the gas generating film, and the wavelength of the laser needs to be selected appropriately in accordance with the absorption of the drop chemicals and gas generating film.

As in the first embodiment described above, a semiconductor laser is known as a light source capable of controlling the pulse width ranging from several microseconds to several tens of microseconds. Since the response speed of the semiconductor laser is several nanoseconds, the pulse width of several microseconds can be controlled with high precision.

The wavelength of the semiconductor laser can be selected from the range from the visible region to the infrared region in accordance with the light absorption of the gas generating film and that of the drop chemicals. It is thus desirable to use a semiconductor laser as a light source.

The coating of a substrate with an SOG solution (chemicals) used as materials of insulation films will now be described. The SOG solution is prepared by dissolving 20%-solid SOG into thinner.

Figure 3A:
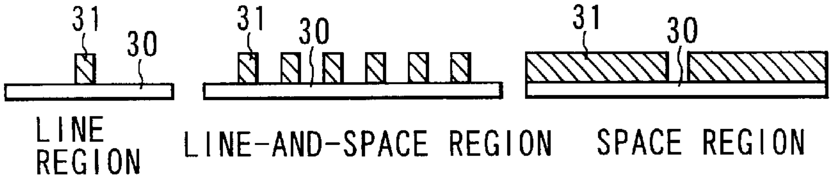
FIG. 3A is a cross-sectional view explaining a deposition method according to the first embodiment of the present invention.

As FIG. 3A shows, structures 31 are each formed of 0.25-$\mu$m-height wiring on a semiconductor substrate 30. The structures 31 make the surface of the substrate 30 uneven. The substrate 30 includes an isolated line region, a line-and-space region and an isolated space region.

In the prior art scan coating method, a film is formed by reciprocating a chemical discharge nozzle in a row direction and turning it at a given pitch while it is discharging an SOG solution continuously. The pitch is set narrower than the width of the spread of an SOG solution dropped onto the substrate. Since the width of the spread is about 200 $\mu$m, the pitch is set at 100 $\mu$m.

The above prior art method allows a flat SOG film to be formed on a flat substrate to be processed. When a base layer is uneven, however, the flatness of a formed SOG film deteriorates under the influence of the pattern of the base layer, as illustrated in FIG. 3B.

Figure 3B:
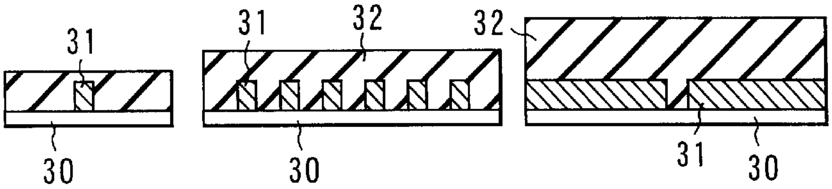
FIG. 3B is a cross-sectional view of an SOG film formed by a prior art deposition method.
Figure 3C:
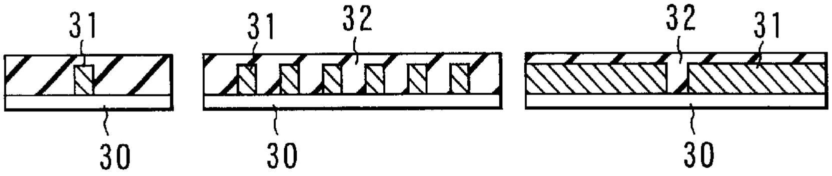
FIG. 3C is a cross-sectional view of an SOG film formed by the deposition method according to the first embodiment of the present invention.

FIG. 3C is a cross-sectional view of a film that is formed by reducing an amount of coating of a thicker region, which is caused by the prior art scan coating method, using the high-pressure gas issuing section of the present invention. In the apparatus of the present invention, a gas generating film of a thicker region is irradiated with a laser beam from the laser oscillator, high-pressure gas is sprayed to an SOG solution, and the SOG solution is collected by the chemical collecting section. As a result, the SOG chemicals dropped to the substrate are decreased.

As FIG. 3C shows, an SOG solution is properly irradiated with a laser beam from the laser oscillator in consistency with the unevenness of the surface of the substrate. Therefore, the amount of SOG solution dropped to the substrate is controlled to form a flat SOG film.

It is seen from FIGS. 3B and 3C that the deposition method of the present invention can improve the flatness of the surface of a substrate rapidly.

[Second Embodiment]

The fact that a time (pulse period) from when a gas generating film is irradiated with a laser beam until when the chemical are blow is long means that the amount of discharge cannot be controlled precisely.

The gas spraying section, which is capable of controlling the amount of discharge of chemicals more accurately by shortening a pulse period, will now be discussed.

In the second embodiment, a gas generating film is preheated by a heating mechanism to shorten a delay time from when the film is irradiated with a laser beam until when it is gasified, and the pulse period of the laser is also shorter. An example of a gas spraying section with the heating mechanism will be explained below.

Figure 4A:
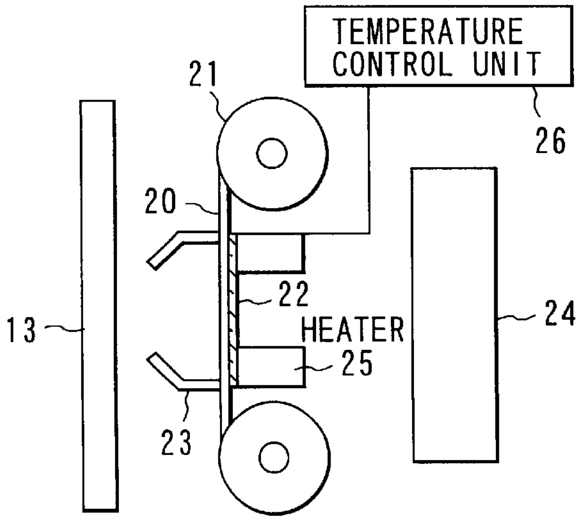
FIGS. 4A and 4B are illustrations of a gas issuing section of a deposition apparatus according to a second embodiment of the present invention.
Figure 4B:
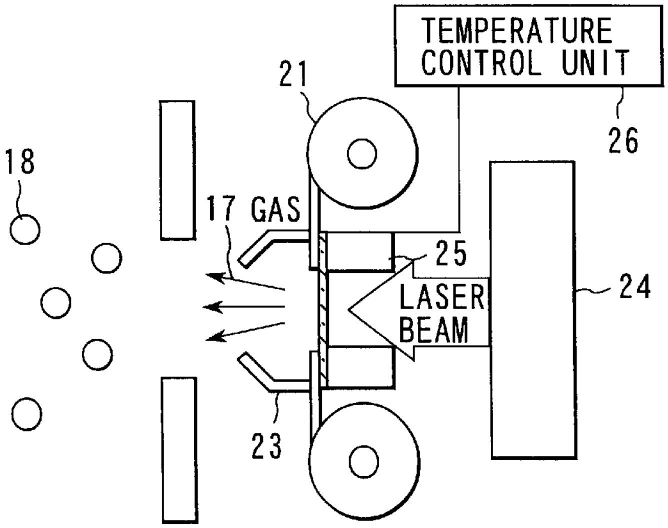

As FIGS. 4A and 4B illustrate, a heater 25 on a transparent substrate 22 heats a gas generating film 20. A temperature control unit 26 controls the heater 25 such that the temperature of the film 20 reaches 150° C. that is lower than that at which the film is gasified.

Figure 5A:
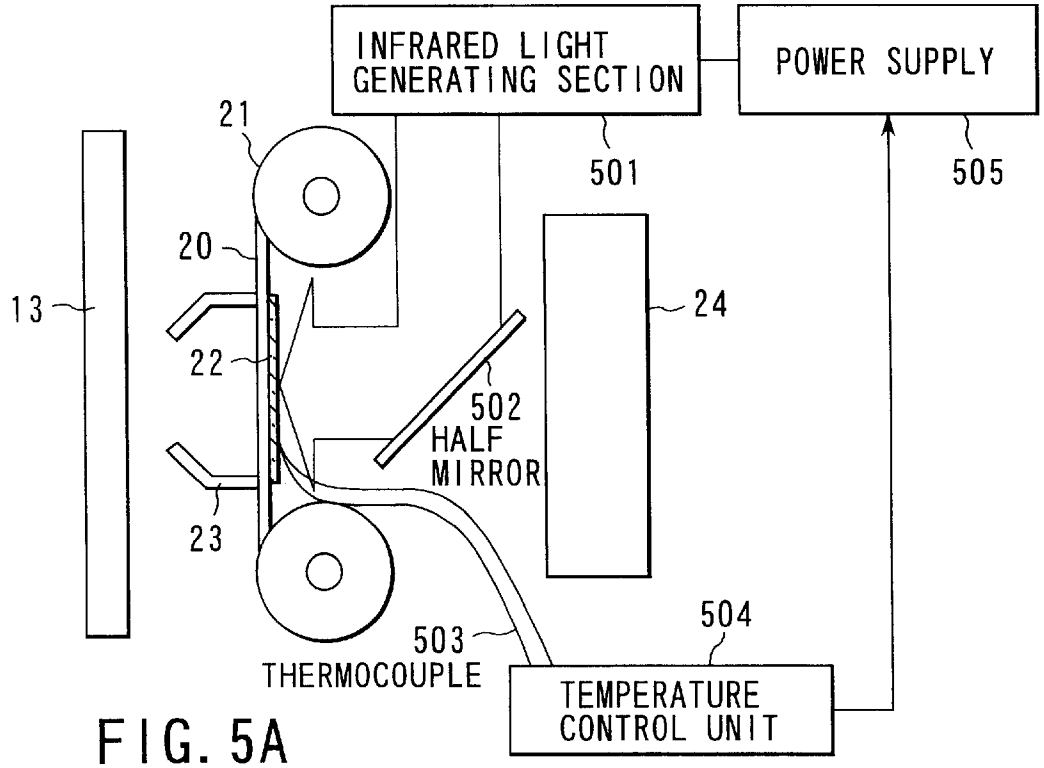
FIG. 5A is an illustration of the structure of the gas issuing section of the deposition apparatus according to the second embodiment of the present invention.
Figure 5B:
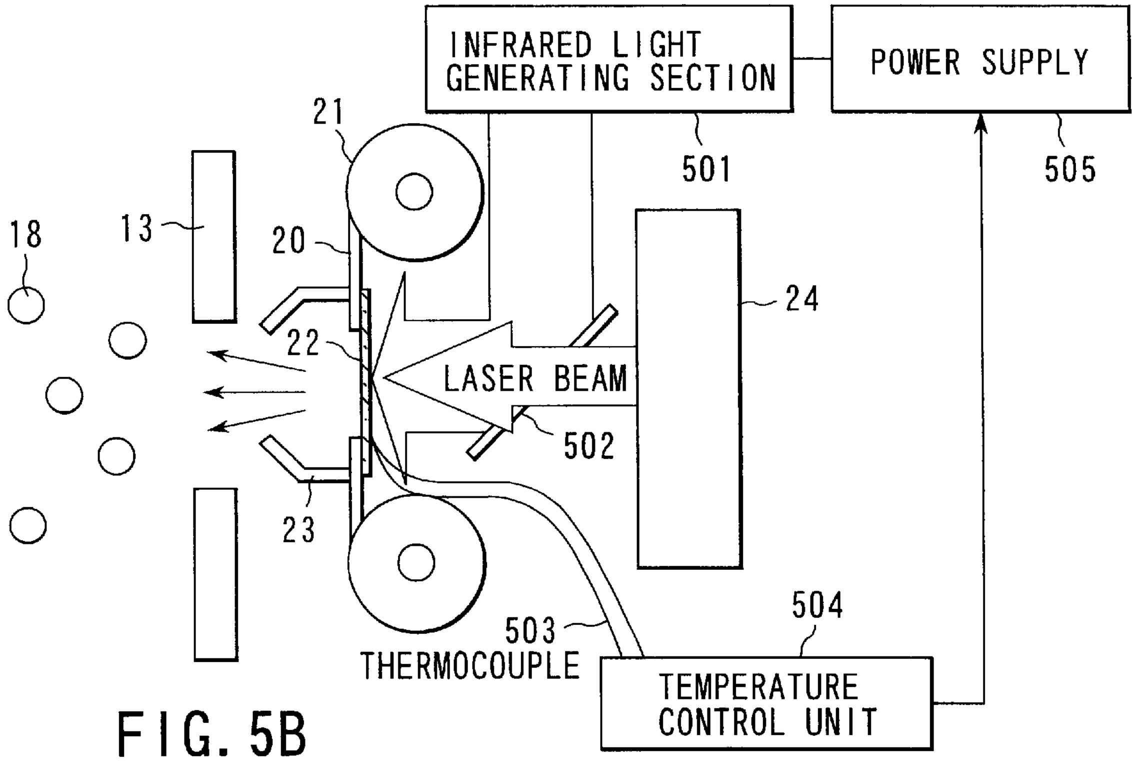
FIG. 5B is another illustration of the structure of the gas issuing section of the deposition apparatus according to the second embodiment of the present invention.

As FIGS. 5A and 5B show, an infrared light generating section 501 generates infrared light and a half mirror 502 reflects the light. The reflected light enters and heats the gas generating film 20. A temperature control unit 504 measures the temperature of the transparent substrate 22 using a thermocouple 503 on the surface of the substrate 22 and thus measures the temperature of the gas generating film 20 indirectly. Based on the measured temperatures, the unit 504 controls a power supply 505 for supplying power to the infrared light generating section 501 such that the temperature of the gas generating film 20 reaches 150° C. that is under the temperature at which the film 20 is gasified. A laser beam emitted from the laser oscillator 24 goes through the half mirror 502 and enters the gas generating film 20, as illustrated in FIG. 5B.

Figure 6A:
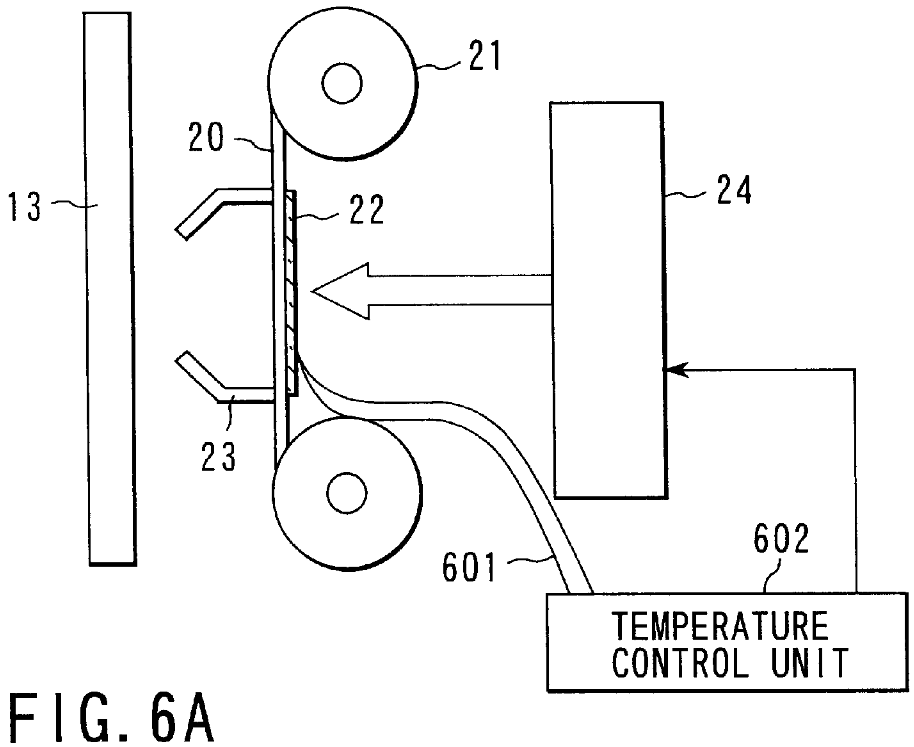
FIG. 6A is still another illustration of the structure of the gas issuing section of the deposition apparatus according to the second embodiment of the present invention.
Figure 6B:
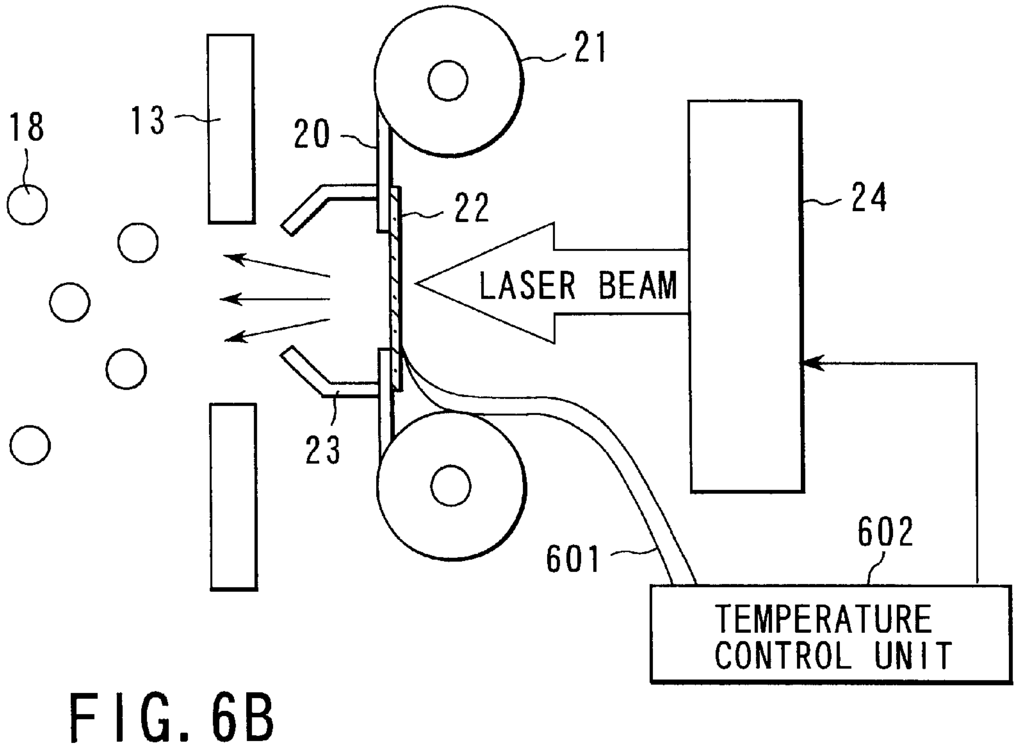
FIG. 6B is yet another illustration of the structure of the gas issuing section of the deposition apparatus according to the second embodiment of the present invention.

Finally, as shown in FIGS. 6A and 6B, the laser oscillator 24 continuously emits a low-energy laser beam toward the gas generating film 20 to increase energy in terms of pulses only when the film 20 is gasified. Another temperature control unit 602 measures the temperature of the transparent substrate 22 using a thermocouple 601 on the surface of the substrate 22 and thus measures the temperature of the gas generating film 20 indirectly. Based on the measured temperatures, the unit 602 controls the output of a laser beam emitted from the laser oscillator 24 such that the temperature of the gas generating film 20 reaches 150° C. that is under the temperature at which the film 20 is gasified.

Figure 7:
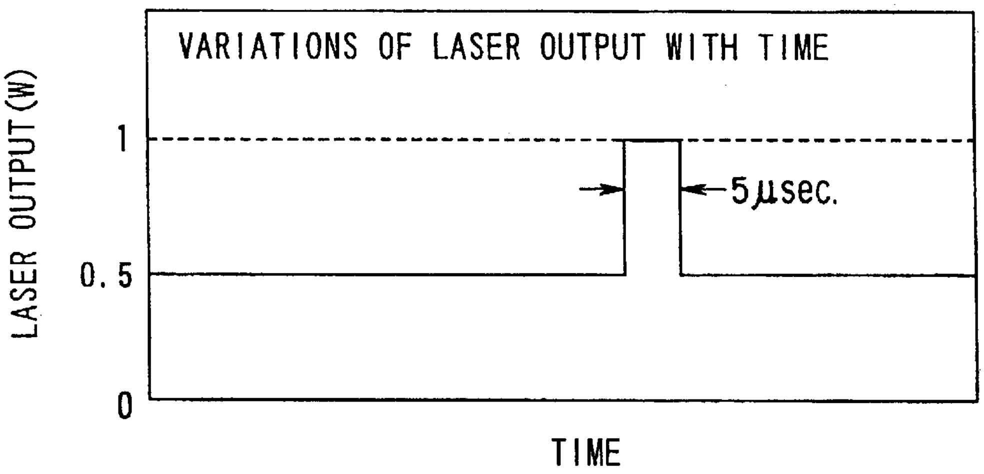
FIG. 7 is a chart showing variations of laser beams output from the gas issuing section shown in FIGS. 6A and 6B with time.

As FIG. 7 shows, the temperature of the gas generating film increases up to 150 ° C. by continuously irradiating the film with a 0.5-W laser beam.

In the foregoing apparatus of the second embodiment, a time period from when a gas generating film is irradiated with 1-W laser beam until when it is gasified can be shortened to about 5 μsec if the temperature of the gas generating film increases up to 150° C. in advance. The thickness of this gas generating film is 5 μm.

As described above, a time period (delay time) from when a gas generating film is irradiated with a laser beam until when it is gasified can be shortened by means of a mechanism for increasing the temperature of the gas generating film in advance. In other words, the amount of discharge of chemicals can be controlled accurately.

In the second embodiment, a gas generating film is preheated to 150° C. and thus a time period from when the film is irradiated with a laser beam until when it generates gas can be shortened to 5 μsec. Consequently, the pulse width and pulse period of the laser beam can be set at 5 μsec. and 20 μsec., respectively. To shorten the pulse period enables the amount of discharge of chemicals to be controlled precisely.

[Third Embodiment]

A deposition apparatus capable of shortening a delay time further to control the amount of discharge of chemicals more precisely, will now be described as a third embodiment.

In order to cut off chemicals continuously, as soon as a laser beam is applied to a certain point of a gas generating film to generate gas therefrom, it necessitates starting to be applied to the next point thereof. In other words, while gas generated from a point of a gas generating film is blowing chemicals, laser irradiation of the next point should be started to increase the temperature of the film.

Figure 8A:
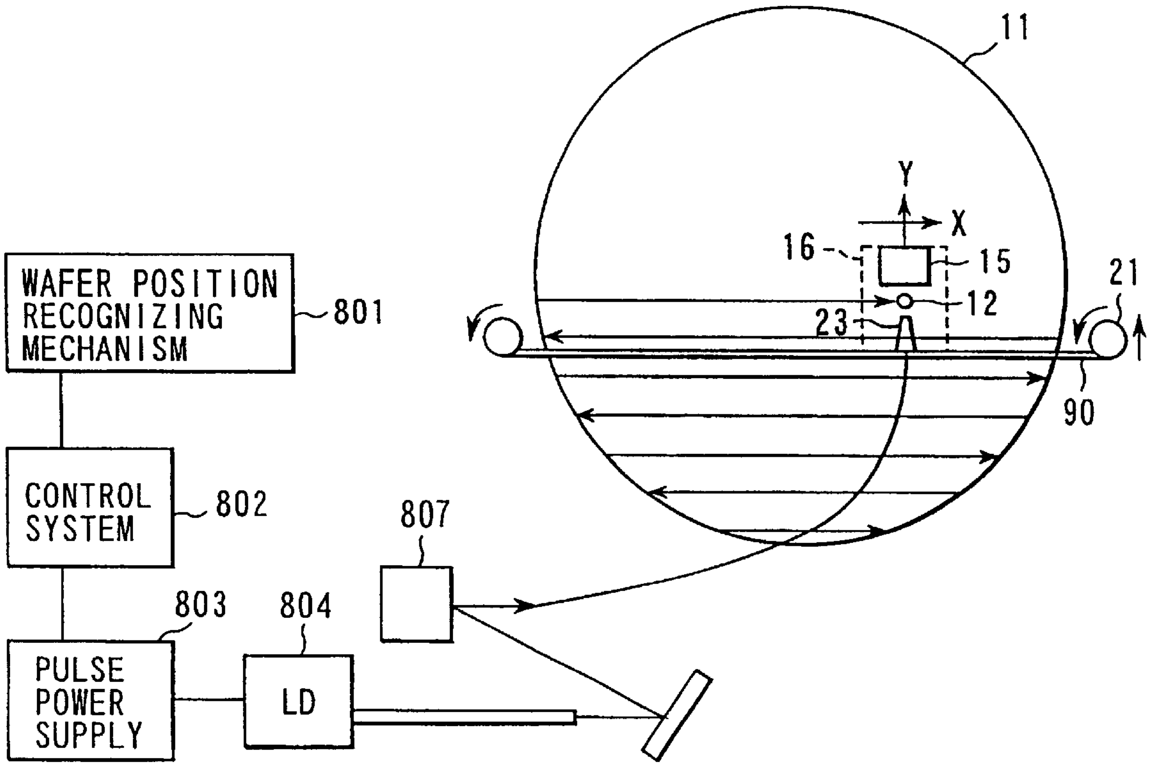
FIG. 8A is a plan view of the structure of a deposition apparatus according to a third embodiment of the present invention.
Figure 8B:
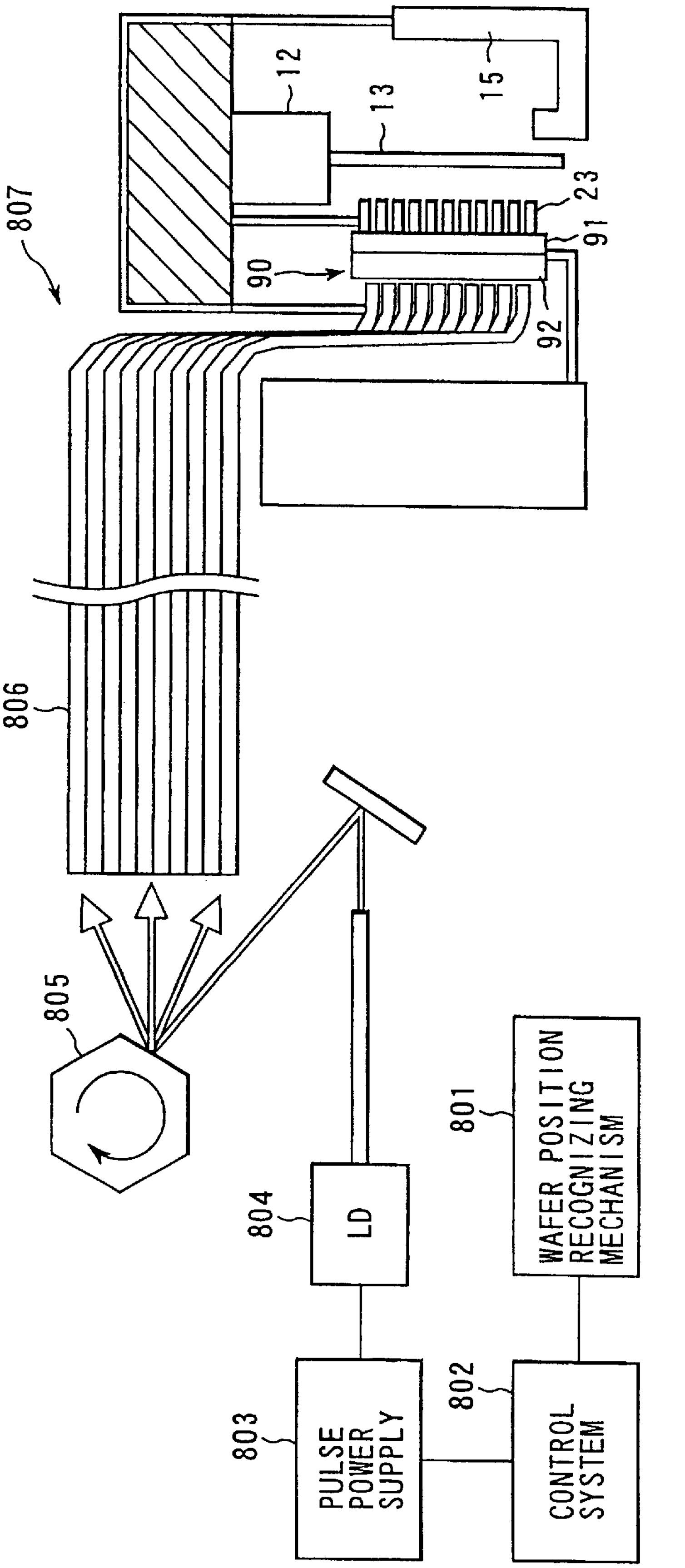
FIG. 8B is a cross-sectional view of the structure of a deposition apparatus according to the third embodiment of the present invention.

FIGS. 8A and 8B illustrate a deposition apparatus according to the third embodiment, which is capable of continuously cutting off chemicals. FIG. 8A is a schematic plan view of the deposition apparatus, and FIG. 8B is a schematic side view thereof.

Referring to FIGS. 8A and 8B, a control system 802 controls a pulse power supply 803 for supplying power to a laser oscillator 804 based on recognition results of a wafer position recognizing mechanism 801 for recognizing a position of chemicals dropped to a wafer to adjust the number of chemicals to be dropped. The control system 802 controls a polygon mirror 805 as well as the pulse power supply 803 to vary a position in which the laser beam emitted from the laser oscillator 804 enters a fiber bundle 807 including a number of optical fibers 806. The laser beam emitted form the fiber bundle 807 enters a tape 90. The tape 90 has a two-layered structure of a transparent film 91 that is transparent to a laser beam and a gas generating film 92 that generates gas by laser irradiation. The tape 90 is provided so as to cross a substrate 11 to be processed and its both end portions are wound by a winding device 21.

On the outgoing side of the fiber bundle 807, the optical fibers 806 are arranged in a direction perpendicular to the winding direction of the gas generating film.

In the apparatus of the third embodiment, the plural optical fibers 806 are tied in a bundle behind the tape 90, and laser beams are applied to different points of the gas generating film 92. A laser beam can be applied to another spot during a time period from when the gas generating film 92 generates gas until when the gas blows chemicals completely. Thus, the pulse period of the laser beam can be shortened and the amount of discharge of chemicals can be controlled more accurately.

[Fourth Embodiment]

According to the first embodiment described above, a film is formed by reducing chemicals discharged in accordance with the unevenness of a substrate to be processed, and the surface of the film is improved in flatness. In the fourth embodiment, a film is formed by patterning a liquid film.

FIG. 9A is a cross-sectional view of the structure of a semiconductor device in which the uppermost wiring layer is buried into a groove of an interlayer insulation film 40. A pad 42 for connecting the device to a mounting substrate as well as wiring 41 is formed in the uppermost wiring layer.

A method of forming an SOG film on the uppermost wiring layer by patterning a liquid film using the deposition apparatus shown in FIGS. 1A and 1B will now be discussed.

According to the deposition method of the present invention, the local control of the amount of coating can prevent a film from being formed on the pad. As has been described above, a 20%-solid SOG solution spreads over a width of about 200 μm after it is dropped. It is thus necessary to increase the viscosity of the solution, improve the volatility thereof and reduce the width of spread thereof when the liquid film is patterned. In the fourth embodiment, an SOG solution contains about 30% solid matter. The temperature of the substrate is set at 350° C. that is higher than the volatile temperature of thinner in order to improve the volatilization of thinner contained in the SOG solution. The width of spread of the SOG film is about 10 μm. Since the size of the pad 42 ranges from 50 μm to 100 μm, a film can selectively be formed in a region other than the pad 42.

FIG. 9B is a cross-sectional view of the above semiconductor device in which an interlayer insulation film 43 is selectively formed as the uppermost layer on a region other than the pad 42. The conventional lithography process or RIE process need not be employed since the interlayer insulation film 43 is not formed on the pad 42, as illustrated in FIG. 9B.

If the amount of discharge of chemicals is controlled by opening and closing a valve, a removed region is as wide as about 1 cm and thus the valve cannot be used in the manufacturing process of a semiconductor device. In the present invention, the width of a removed region is about 10 μm and thus the amount of deposition can be controlled in a very small region.

Using the above technique of the present invention, patterning can be performed concurrently with deposition without using a process technique such as a lithography process and a laser ablation technique.

In the fourth embodiment, too, the width of a removed region can be decreased by shortening the pulse period of a laser beam. Hence, the width of the removed region can be decreased further using the apparatuses of the second and third embodiments.

[Fifth Embodiment]

The above-described deposition apparatus has the following problem: The chemicals, which are blown by high-pressure gas generated from the gas generating film by laser irradiation, are scattered from the wall of the chemical collecting section 15 and the scattered chemicals fly on the substrate, thereby causing dust. To resolve this problem, an aspiration type chemical collecting section is employed in the fifth embodiment.

FIGS. 10A and 10B are schematic views of the structure of a deposition apparatus according to a fifth embodiment of the present invention. In FIGS. 10A and 10B, the same constituting elements as those in FIGS. 1A and 1B are indicated by the same reference numerals and their descriptions are omitted.

As FIGS. 10A and 10B illustrate, the deposition apparatus prevents chemicals 18, which are blown by gas generated from a high-pressure gas spraying section 14, from being scattered from the wall of a chemical collecting section 51 because the chemical collecting section 51 is connected to a vacuum pump 52.

The above dust is caused not only by blown chemicals scattered from the wall of the chemical collecting section but also by mist appearing on the periphery of chemicals dropped from a chemical discharging nozzle.

The aspiration type chemical collecting section can remove the mist. The dust can thus be inhibited from flying.

If the chemical collecting section 15 is not of an aspiration type like that shown in FIGS. 1A and 1B, chemicals are scattered from the wall of the section 15 onto the substrate to cause dust 60 slightly as illustrated in FIGS. 11A and 11B. If a vacuum pump is connected to the chemical collecting section 15, dust 60 is hardly caused as shown in FIGS. 11C and 11D. Therefore, the aspiration type chemical collecting section using a vacuum pump can inhibit chemicals from flying. FIG. 11B is also an enlarged cross sectional view of portion XIB of FIG. 11A. FIG. 11D is also an enlarged cross sectional view of portion XID of FIG. 11C.

[Sixth Embodiment]

According to the fifth embodiment, the aspiration type chemical collecting section is provided separately form a gas spraying nozzle 23 for guiding gas 17 generated by laser irradiation to the dropped chemicals 13. In the sixth embodiment, a chemical collecting section and a gas spraying nozzle are integrated as one component to improve the efficiency of blow of chemicals 13 and the ability to collect them.

FIGS. 12A, 12B and 12C is a schematic view of the structure of a nozzle 70 for use in a deposition apparatus according to a sixth embodiment of the present invention. More specifically, FIG. 12A is a schematic view of the nozzle 70, FIG. 12B is a cross-sectional view of the outlet 72 of the nozzle 70, and FIG. 12C is a cross-sectional view of the inlet 71 of the nozzle 70.

As FIGS. 12A to 12C illustrates, the nozzle 70 includes the inlet 71 for introducing gas and an outlet 72 for collecting the blown chemicals, which are integrated as one component. The nozzle 70 has a hole 73 in its center. The chemicals 13 pass through the hole 73. The nozzle also has a vent hole 74 for preventing air currents from being produced when a vacuum pump is attached to/detached from the outlet 72.

Figure 13A:
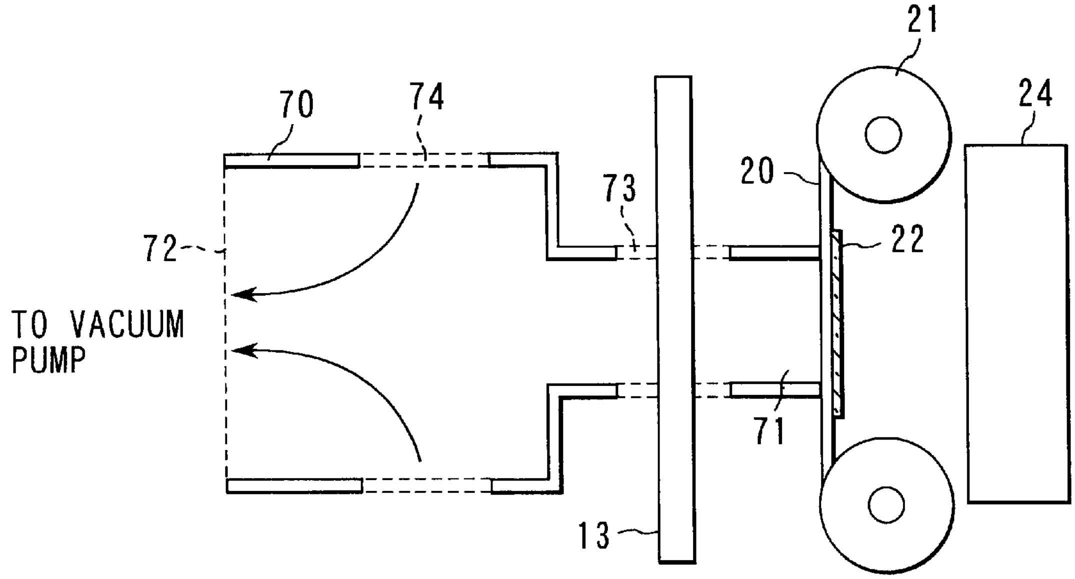
FIG. 13A is an illustration of the nozzle shown in FIG. 12, which is set in the deposition apparatus.

FIG. 13A illustrates the nozzle 70 that is set in the deposition apparatus. The inlet 71 is brought into intimate contact with a gas generating film 20 and the outlet 72 is connected to the vacuum pump. When the vacuum pump aspirates chemicals, air currents are produced from the vent hole 74 toward the outlet 72 as indicated by the arrows in FIG. 13A.

Figure 13B:
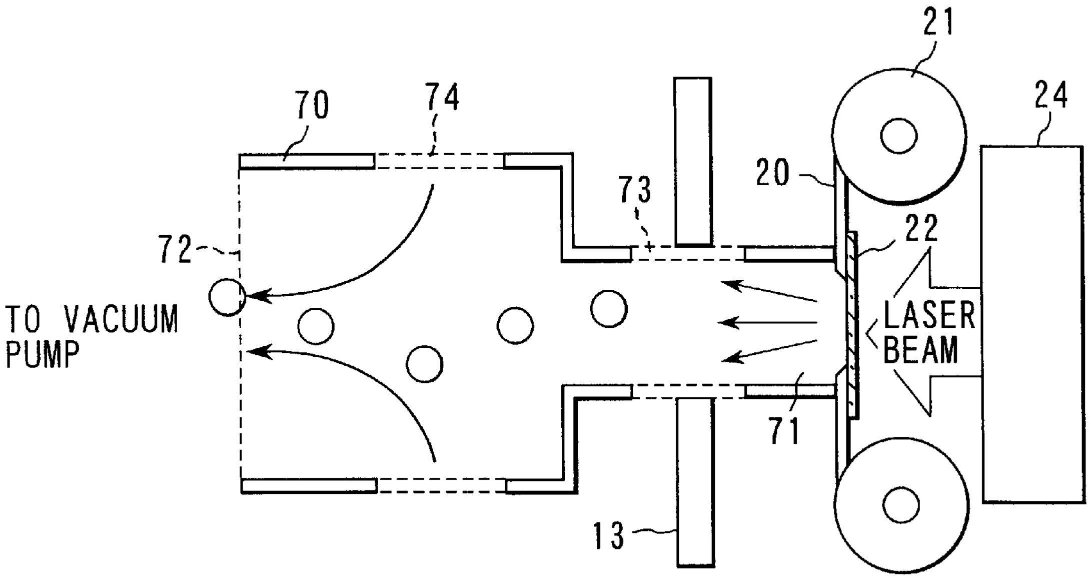
FIG. 13B is another illustration of the nozzle shown in FIG. 12, which is set in the deposition apparatus.

When a laser oscillator 24 applies a laser beam to the gas generating film 20, the chemicals 13, which are to be dropped in front of the film 20, are blown. The blown chemicals 18 are discharged from the outlet 72 efficiently as illustrated in FIG. 13B.

If chemicals are blown using the gas spraying nozzle 23 shown in FIGS. 2A and 2B, turbulent air is produced in front of the nozzle 23 and thus gas pressure cannot efficiently be transmitted to the chemicals 13 from the gas generating film 20. Since the gas generating film 20 needs to have a thickness of 5 μm or more, a 1-W-more laser is required. The nozzle 70 of the sixth embodiment controls the turbulent air; therefore, the gas generating film 20 can be thinned to 2 μm and the power of the laser can be lowered to 0.4 -W.

About 10 μsec. are required for gasifying a 5-μm-thickness gas generating film with a 1-W laser beam, whereas about 5 μsec. are required for gasifying a 2-μm-thickness gas generating film with the 1-W laser beam. In other words, the nozzle 70 of the sixth embodiment allows a low power laser or higher-speed control.

If a gas spraying nozzle is not used as disclosed in U.S. patent application Ser. No. 09/335,508, the generated gas causes turbulent air to make it impossible to blow the dropped chemicals with efficiency.

If a gas spraying nozzle is used, the dropped chemicals can be blown and the 5-μm-thickness gas generating film starts to be gasified in about 10 μsec. after the film is irradiated with 1-W laser beam.

Without using a gas spraying nozzle, gas pressure cannot be transmitted to the dropped chemicals efficiently. It is thus necessary to use a 50-μm-thickness gas generating film in order to blow the dropped chemicals.

Furthermore, about 10 μsec. are required from when the gas generating film is irradiated with a 1-W laser beam and until when it is gasified.

If the apparatus includes no gas spraying nozzle, the generated gas produces turbulent air. The blown chemicals are scattered in all directions and cannot efficiently be collected in the chemical collecting section set in the lower part of the apparatus. The problem that the chemicals are adhered to the substrate to be processed and various points of the apparatus occurs.

As described above, when no gas spraying nozzle is used, the gas generating film should be thickened, and the time from when the gas generating film is irradiated with a laser beam until when it is gasified is lengthened. Further, the problem that the blown chemicals are scattered in all directions occurs. Consequently, it is desirable to set the gas spraying nozzle in front of the gas generating film.

[Seventh Embodiment]

In the deposition apparatus shown in FIGS. 1A and 1B, a film is formed by operating the driving section 16 including both the chemical discharging nozzle 12 and high-pressure gas spraying section 14 on the substrate 11. The gas spraying section 14 includes the laser oscillator 24 having a semiconductor laser and an optical lens and the winding device 21 for winding the gas generating film 20. In order to operate the driving section 16 with high controllability, it should be designed compact and so should be the high-pressure spraying section 14 as compact as possible.

The structure of the above apparatus greatly restricts the amount of gas contained in the gas generating film. Since only a small-sized semiconductor laser can be used, its laser power is also greatly restricted. In the first embodiment, the overall length of the gas generating film is about 10 μm. The diameter of the laser beam is 100 μm and thus the number of coated spots can be reduced by only $10^5$.

The seventh embodiment is directed to the structure of a deposition apparatus capable of increasing the number of spots that can be reduced in chemicals.

Figure 14A:
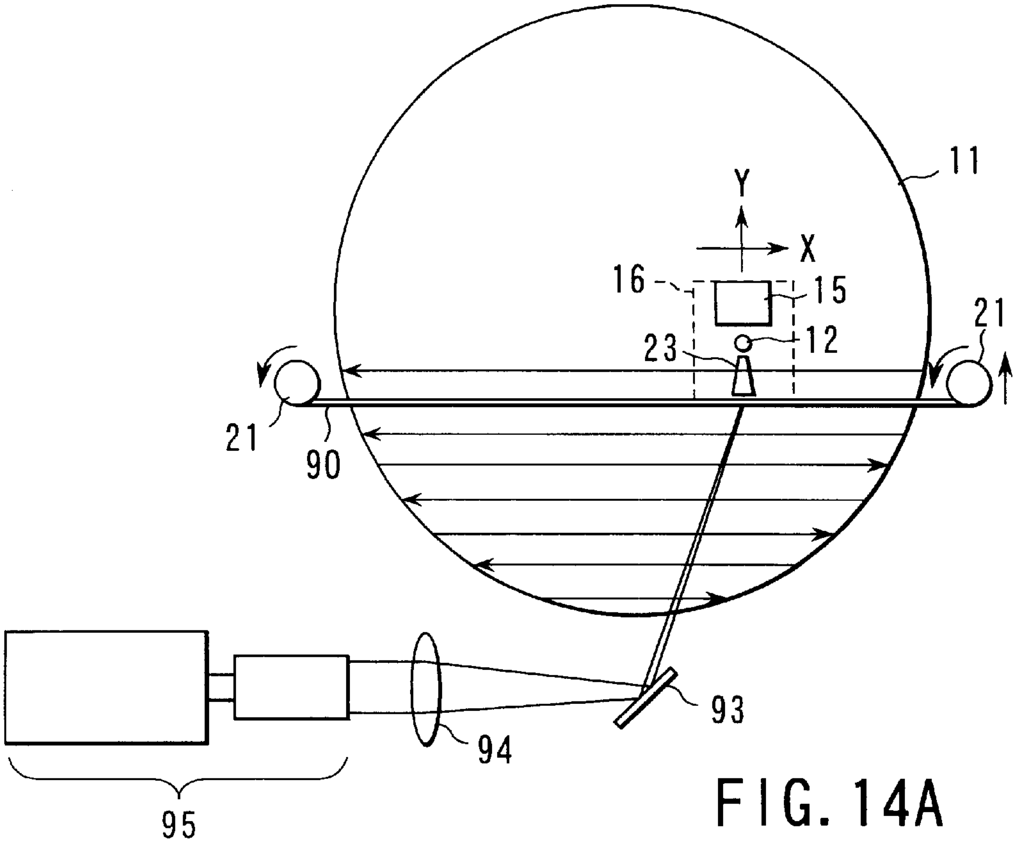
FIG. 14A is a schematic plan view of the structure of a deposition apparatus according to a seventh embodiment of the present invention.
Figure 14B:
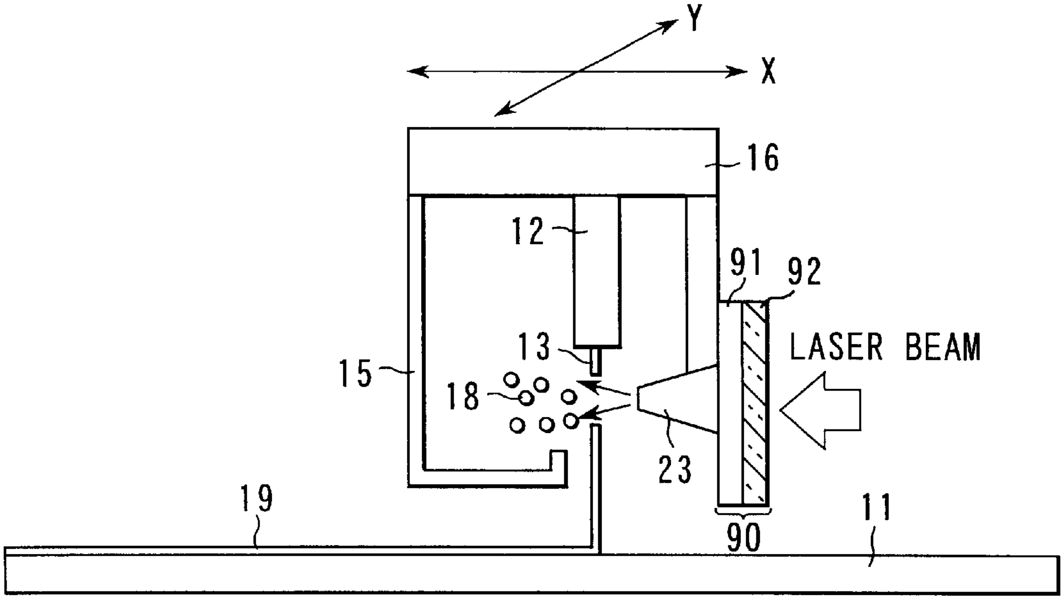
FIG. 14B is a cross-sectional view of the structure of the deposition apparatus according to the seventh embodiment of the present invention.

FIGS. 14A and 14B schematically show the structure of a deposition apparatus according to the seventh embodiment of the present invention. FIG. 14A is a plan view of the deposition apparatus, and FIG. 14B is a side view thereof.

Referring to FIGS. 14A and 14B, a laser oscillator 95 is provided alongside a substrate 11 to be processed. The irradiation points of laser beams emitted from the laser oscillator 95 are controlled by a polygon mirror 93. The alignment accuracy of the polygon mirror is ±5 μm and considerably smaller than the beam diameter of 100 μm; therefore, the points can be irradiated with the laser beams with high precision.

A tape 90 has a two-layered structure of a transparent film 91 that is transparent to the laser beams and a gas generating film 92 that generates gas by laser irradiation. The tape 90 is provided so as to cross the substrate 11 and its both end portions are wound by a winding device.

A driving section 16 includes a chemical discharging nozzle 12, a chemical collecting section 15, and a gas spraying nozzle 23. The driving section 16 moves along the gas generating film (in the direction of X) from one end to the other end of the substrate, then in the direction of Y, and in the direction opposite to the direction of X.

A lens 94 has a moving mechanism such that a laser beam is focused on the plane of the gas generating film 20 even though the irradiation spot of the laser beam moves as the driving section 16 does. The position of the mirror 93 is controlled in accordance with the movement of the driving section 16 so as to fix the distance from the lens 94 to the gas generating film 20 via the mirror 93.

The above structure greatly increases the number of spots that can be reduced in chemicals. No laser oscillators need to be mounted on the driving section. It is thus possible to use a solid laser such as a high-power semiconductor laser and YAG laser and a gas laser such as an KrF excimer laser, which require a large setting area.

[Eighth Embodiment]

In the foregoing embodiments, a film is formed by controlling the amount of coating by blowing chemicals dropped from the chemical discharging nozzle by gas generated from the gas generating film by laser irradiation.

Figure 15A:
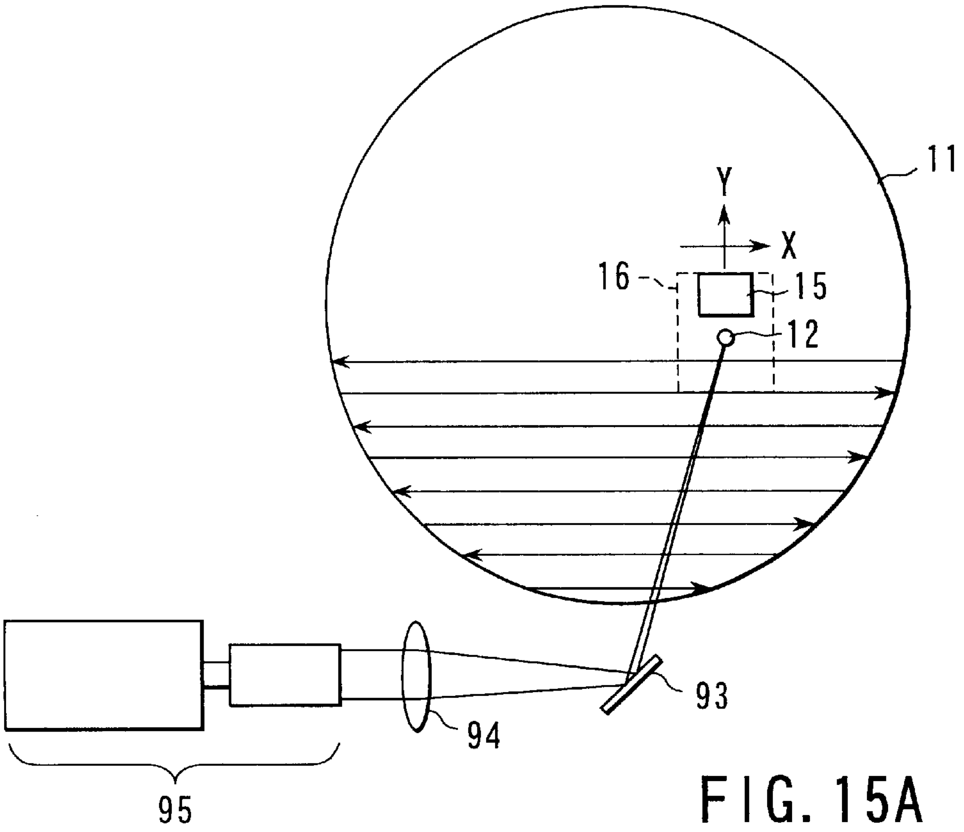
FIG. 15A is a schematic plan view of the structure of a deposition apparatus according to an eighth embodiment of the present invention.
Figure 15B:
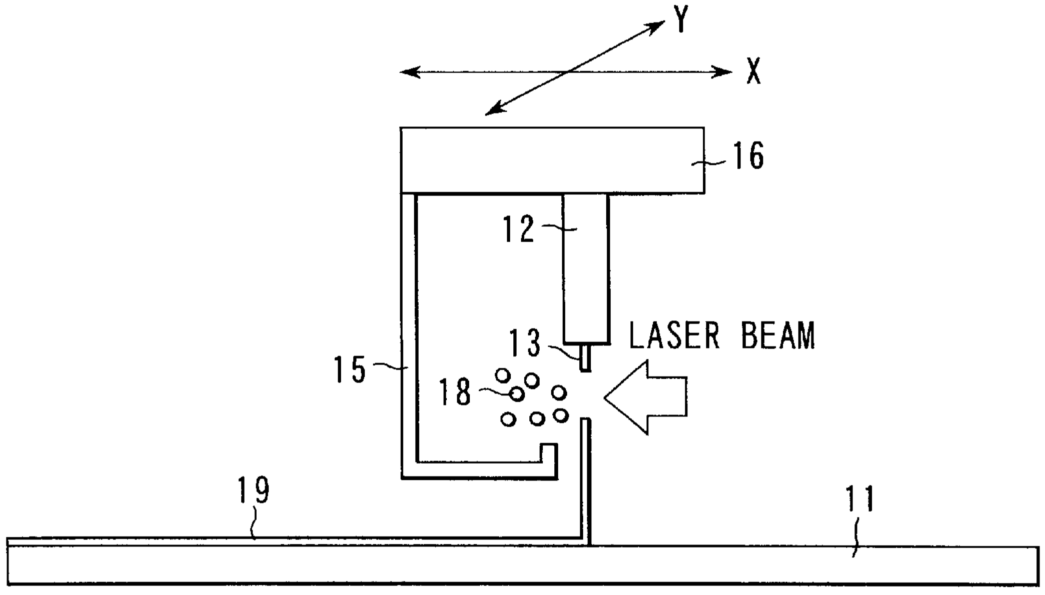
FIG. 15B is a schematic cross-sectional view of the structure of the deposition apparatus according to the eighth embodiment of the present invention.

FIGS. 15A and 15B schematically show the structure of a deposition apparatus according to an eighth embodiment of the present invention. FIG. 15A is a plan view of the deposition apparatus, and FIG. 15B is a side view thereof. In FIGS. 15A and 15B, the same constituting elements as those in FIGS. 14A and 14B are indicated by the same reference numerals and their descriptions are omitted.

In the apparatus of the eighth embodiment, a laser beam is directly applied to the dropped chemicals without using any gas generating film.

An SOG solution does not absorb a 780-nm-wavelength laser beam emitted from a semiconductor laser. In the eighth embodiment, therefore, the about-1-% coloring agent that absorbs infrared light as described in the first embodiment is directly added to SOG chemicals.

When the coloring-agent-added SOG chemicals are irradiated with a laser beam, they increase in temperature and can be blown. However, the required energy is about ten times as high as that when a gas generating film is used. In other words, when the beam diameter is 10 $\mu$m $\phi$ and the pulse width is 10 $\mu$sec., an about-10-W laser is required.

Since the 10-W laser is larger than a laser of 1 -W or lower, no laser oscillator cannot be mounted on the driving section 16. To directly apply a laser beam to chemicals, as shown in FIG. 15A, a laser oscillator has to be set separately from the driving section and a lens needs to have a moving mechanism for correcting variations in irradiation points in accordance with the movement of the driving section.

If a laser having a wavelength of visible and infrared rays is used, a solvent does not absorb light and thus a coloring agent has to be added to chemicals. If, however, a DUV laser such as an KrF excimer laser and a YAG fourth harmonic laser, a solvent contained in chemicals absorbs light. The chemicals can thus be blown without adding a coloring agent to the chemicals, and the amount of coating of chemicals can be controlled to form a film.

The KrF excimer laser and YAG fourth harmonic laser are relatively large in size and impossible to set in a driving section. However, these lasers can be used if they are provided separately from the driving section and a moving mechanism for correcting variations in irradiation points in accordance with the movement of the driving section is added to a lens, as illustrated in FIG. 15A.

The present invention is not limited to the above embodiments. Various changes and modifications can be made without departing from the scope of the subject matter of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A deposition apparatus comprising:

a chemical discharging nozzle for continuously discharging chemicals to a substrate to be processed;

a gas spraying section arranged below the chemical discharging nozzle, for spraying gas on the chemicals discharged from the chemical discharging nozzle and changing an orbit of the chemicals by pressure of the gas;

a chemical collecting section for collecting the chemicals the orbit of which is changed by the gas spraying section, the chemical collecting section being arranged so as to interpose the chemicals between the gas spraying section and the chemical collecting section; and moving means for moving the chemical discharging nozzle and the substrate relatively with each other, wherein the gas spraying section includes:

a laser oscillator for emitting a pulse laser beam; and a gas generating film that generates the gas when heated and gasified by the laser beam emitted from the laser oscillator.

2. The deposition apparatus according to claim 1, further comprising a gas spraying nozzle for spraying gas on the chemical discharging nozzle.

3. The deposition apparatus according to claim 1, further comprising a temperature control mechanism for heating the gas generating film to a temperature at which the gas generating film is not gasified.

4. The deposition apparatus according to claim 3, wherein the temperature control mechanism includes a heater.

5. The deposition apparatus according to claim 3, wherein the temperature control mechanism includes an infrared light irradiating section for irradiating the gas generating film with infrared light.

6. The deposition apparatus according to claim 1, wherein the gas generating film is shaped like a tape and the apparatus further comprises a winding device for winding the gas generating film.

7. The deposition apparatus according to claim 6, further comprising a plurality of optical fibers arranged in a direction perpendicular to a winding direction of the gas generating film, the laser beam emitted from the laser oscillator being applied to the gas generating film through any of the optical fibers.

8. The deposition apparatus according to claim 1, further comprising an aspiration device for aspirating chemicals blown by the gas.

9. The deposition apparatus according to claim 8, wherein the apparatus further comprises a nozzle whose outlet is connected to the aspiration device, and the nozzle includes an inlet for introducing the gas generated from the gas generating film, and a pair of chemical passage holes through which the chemicals pass, the pair of chemical passage holes being provided between the inlet and the outlet.

10. The deposition apparatus according to claim 9, wherein the nozzle further includes a vent hole formed between the chemical passage holes and the outlet.

11. The deposition apparatus according to claim 1, wherein the laser oscillator is a semiconductor laser.

12. A deposition apparatus comprising:

a chemical discharging nozzle for continuously discharging chemicals to a substrate to be processed;

a gas spraying section arranged below the chemical discharging nozzle, for spraying gas on the chemicals discharged from the chemical discharging nozzle and changing an orbit of the chemicals by pressure of the gas;

a chemical collecting section for collecting the chemicals the orbit of which is changed by the gas spraying section, the chemical collecting section being arranged so as to interpose the chemicals between the gas spraying section and the chemical collecting section; and moving means for moving the chemical discharging nozzle and the substrate relatively with each other, wherein the gas spraying section includes:

a light emitting section for emitting light;

a tape-shaped gas generating film that generates the gas when heated and gasified by the light emitted from the light emitting section; and a winding device for winding the gas generating film.

13. The deposition apparatus according to claim 12, further comprising a gas spraying nozzle for spraying gas on the chemical discharging nozzle.

14. The deposition apparatus according to claim 12, further comprising a temperature control mechanism for heating the gas generating film to a temperature at which the gas generating film is not gasified.

15. The deposition apparatus according to claim 14, wherein the temperature control mechanism includes a heater.

16. The deposition apparatus according to claim 14, wherein the temperature control mechanism includes an infrared light irradiating section for irradiating the gas generating film with infrared light.

17. The deposition apparatus according to claim 12, further comprising an aspiration device for aspirating chemicals blown by the gas.

18. The deposition apparatus according to claim 17, wherein the apparatus further comprises a nozzle whose outlet is connected to the aspiration device, and the nozzle includes an inlet for introducing the gas generated from the gas generating film, and a pair of chemical passage holes through which the chemicals pass, the pair of chemical passage holes being provided between the inlet and the outlet.

19. The deposition apparatus according to claim 18, wherein the nozzle further includes a vent hole formed between the chemical passage holes and the outlet.

* * * * *